United States Patent
Ryo et al.

(10) Patent No.: US 9,748,119 B2
(45) Date of Patent: Aug. 29, 2017

(54) WAFER PROCESSING METHOD

(71) Applicant: DISCO CORPORATION, Tokyo (JP)

(72) Inventors: Senichi Ryo, Tokyo (JP); Hirokazu Matsumoto, Tokyo (JP); Toshiyuki Yoshikawa, Tokyo (JP); Yukinobu Ohura, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/219,499

(22) Filed: Jul. 26, 2016

(65) Prior Publication Data
US 2017/0032985 A1 Feb. 2, 2017

(30) Foreign Application Priority Data
Jul. 29, 2015 (JP) .................. 2015-150048

(51) Int. Cl.
| | | |
|---|---|---|
| *H01L 21/67* | (2006.01) | |
| *H01L 29/20* | (2006.01) | |
| *B23K 26/364* | (2014.01) | |
| *B23K 26/402* | (2014.01) | |
| *B23K 26/18* | (2006.01) | |
| *H01L 21/683* | (2006.01) | |
| *B23K 103/00* | (2006.01) | |

(52) U.S. Cl.
CPC ........ *H01L 21/67051* (2013.01); *B23K 26/18* (2013.01); *B23K 26/364* (2015.10); *B23K 26/402* (2013.01); *H01L 21/6715* (2013.01); *H01L 21/67034* (2013.01); *H01L 21/67092* (2013.01); *H01L 29/20* (2013.01); *B23K 2203/50* (2015.10); *B23K 2203/56* (2015.10); *H01L 21/6838* (2013.01)

(58) Field of Classification Search
CPC . H01L 21/00; H01L 21/288; H01L 21/67051; H01L 21/6715; H01L 21/67034; H01L 29/20; H01L 21/6838; H01L 21/68714; C23C 18/1608; Y10S 148/028; B23K 26/402; B23K 26/18; B23K 26/364; B23K 2203/56
USPC ........................................ 438/758
See application file for complete search history.

(56) References Cited

U.S. PATENT DOCUMENTS

| | | | | |
|---|---|---|---|---|
| 2006/0105544 A1* | 5/2006 | Takanashi | ................ | C09D 5/32 438/460 |
| 2009/0170742 A1* | 7/2009 | Chuang | ................ | C11D 7/3209 510/175 |

FOREIGN PATENT DOCUMENTS

JP  2006-140311  6/2006

OTHER PUBLICATIONS

Gimm, D; KR 2010053126; May 20, 2010.*

* cited by examiner

*Primary Examiner* — Caleen Sullivan
(74) *Attorney, Agent, or Firm* — Greer Burns & Crain, Ltd.

(57) ABSTRACT

Disclosed herein is a wafer processing method in which laser processing is carried out on a wafer along streets. The wafer processing method includes a step of holding the wafer by a chuck table, a protective film forming step of forming a water-soluble protective film on a surface of the wafer, a laser beam irradiating step of irradiating the wafer with a laser beam along the streets after the protective film forming step, a step of supplying a chemical having an amino group to the wafer, and a removing step of cleaning and removing a compound that is generated by the supplying of the chemical having an amino group and contains phosphorus.

18 Claims, 8 Drawing Sheets

WAFER PROCESSING METHOD

BACKGROUND OF THE INVENTION

Field of the Invention

The present invention relates to a wafer processing method of irradiating a wafer with a laser beam to divide the wafer into plural devices.

Description of the Related Art

In general, in manufacturing of devices, plural chip regions are marked out by plural streets (planned dividing lines) arranged in a lattice manner on a surface of a wafer and the devices such as integrated circuits (ICs) and large scale integrations (LSIs) are formed in these chip regions. For division of these devices, laser processing of irradiating the wafer with a laser beam along the streets on the wafer to form grooves in the wafer surface is used.

In this kind of laser processing, minute dust called debris is generated and scattered to be deposited on the surfaces of the devices when the wafer is irradiated with the laser beam, so that the quality of the devices is lowered. For this reason, a processing method has been proposed in which laser processing is carried out after a protective film is applied on a surface of a wafer in advance and debris adhering onto the protective film is cleaned and removed together with the protective film (for example, refer to Japanese Patent Laid-Open No. 2006-140311).

SUMMARY OF THE INVENTION

Incidentally, in the case of a wafer in which a substrate is formed of a phosphorus compound and metal electrodes such as bumps are provided on the surfaces of devices, an element (for example phosphorus) configuring the wafer is liberated and diffused due to the laser processing. It has been proved that, after the protective film is cleaned and removed, this diffused element reacts with nitrogen, oxygen, and water in air and a foreign matter is generated on the metal electrodes. This foreign matter lowers device characteristics such as electrical characteristics and therefore it is preferable to immediately remove the foreign matter. However, the generation rate of the foreign matter is low and therefore it is difficult to remove the foreign matter simultaneously with the protective film when cleaning the protective film.

Therefore, an object of the present invention is to provide a wafer processing method that can effectively suppress generation of a foreign matter.

In accordance with an aspect of the present invention, there is provided a wafer processing method in which a wafer in which devices are formed in a plurality of regions marked out by a plurality of streets formed in a lattice manner on a surface of a substrate composed of a phosphorus compound and metal electrodes are formed over the surface is subjected to laser processing along the streets. The wafer processing method includes a step of holding the wafer by a chuck table, a protective film forming step of forming a water-soluble protective film on a surface of the wafer, a laser beam irradiating step of irradiating the wafer with a laser beam along the streets after the protective film forming step, a step of supplying a chemical having an amino group to the wafer, and a removing step of cleaning and removing a compound that is generated on the wafer by the supplying of the chemical and contains phosphorus.

Preferably, the step of supplying the chemical having an amino group to the wafer is carried out before the laser beam irradiating step, and the chemical having an amino group is mixed into the water-soluble protective film and is supplied to the surface of the wafer.

According to the present invention, the surface of the wafer is treated by using the chemical having an amino group. This provides the state in which a foreign matter is generated less readily on the surface of the wafer, which can favorably keep the device characteristics.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

A wafer processing method according to an embodiment of the present invention will be described. The present invention is not limited by contents described in the following embodiment. Furthermore, in constituent elements described below, what can be easily envisaged by those skilled in the art and what is substantially the same are included. Moreover, it is possible to combine configurations described below as appropriate. In addition, various kinds of omission, replacement, or change of a configuration can be carried out without departing from the gist of the present invention.

Figure 1:
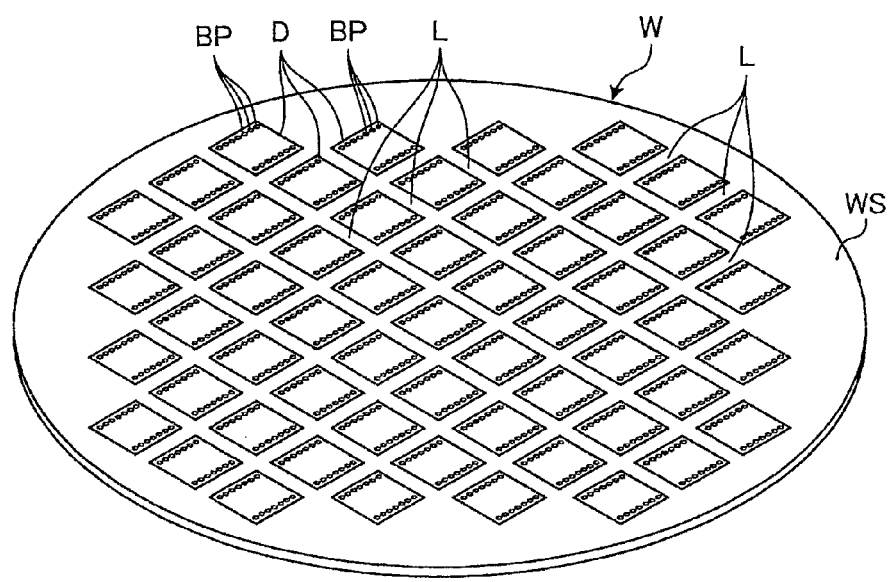
FIG. 1 is a perspective view of a wafer that is a processing target of a wafer processing method according to an embodiment of the present invention.
Figure 2:
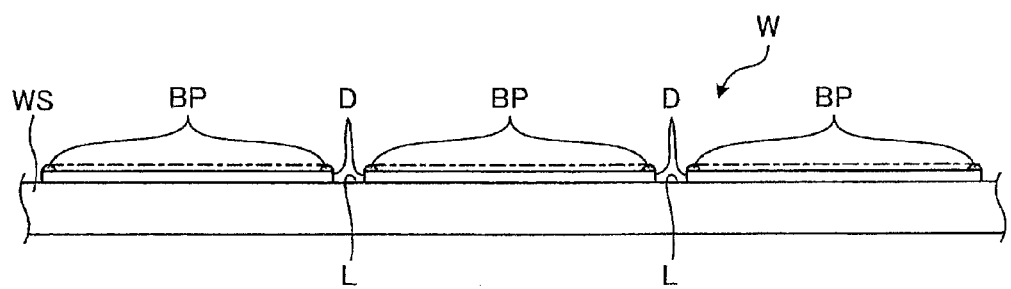
FIG. 2 is a side view of the major part of the wafer shown in FIG. 1.

FIG. 1 is a perspective view of a wafer that is a processing target of a wafer processing method according to the present embodiment and FIG. 2 is a side view of the major part of the wafer shown in FIG. 1. A wafer (processing-target object) W is a semiconductor wafer or an optical device wafer having a substrate WS with a circular disc shape as shown in FIG. 1. Furthermore, the wafer W is an indium phosphide wafer whose substrate WS is formed of indium phosphide (InP; phosphorus compound). In the wafer W, plural streets (planned processing lines) L are formed in a lattice manner on a surface of the wafer W and a device D is formed in each of the respective regions marked out by the plural streets L as shown in FIG. 1 and FIG. 2. Furthermore, the devices D of the wafer W have bumps BP as plural metal electrodes each formed to protrude from the surface of the device D. These bumps BP are one example of the metal electrode and are formed of a noble metal such as gold (Au) or platinum (Pt) or an alloy such as Sn—Cu for example. Although the configuration in which the bumps BP are provided as one example of the metal electrode is employed in the present embodiment, the shape, position, and size of the metal electrode can be changed as appropriate as long as the metal electrode is disposed to be exposed on the surface of the device D.

Figure 3:
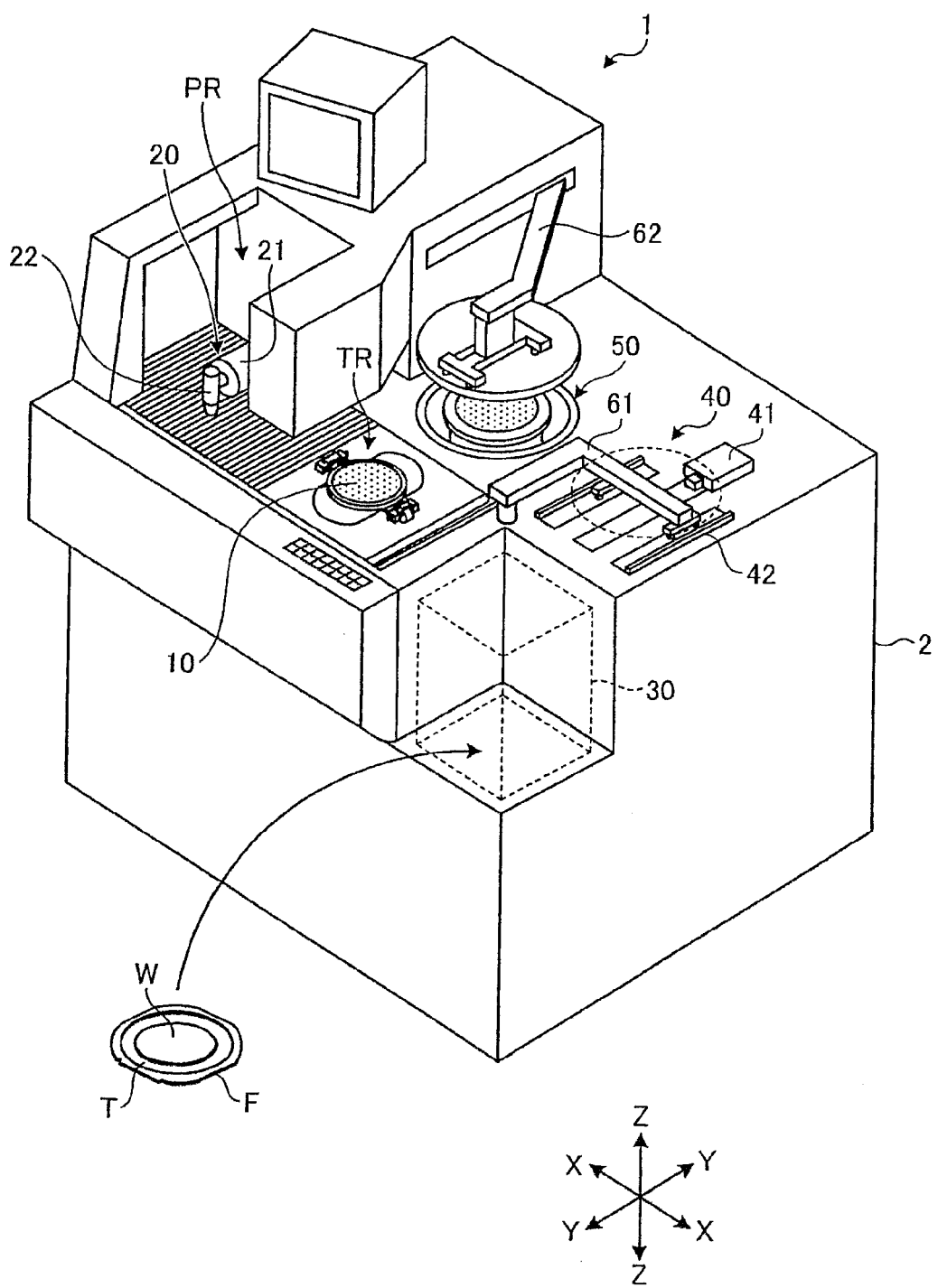
FIG. 3 is a perspective view showing a configuration example of laser processing apparatus.

FIG. 3 is a perspective view showing a configuration example of laser processing apparatus used for the wafer processing method according to the present embodiment. Laser processing apparatus 1 is not limited to the configuration example shown in FIG. 3. The laser processing apparatus 1 forms a water-soluble protective film on the surface of the wafer W and irradiates the wafer W with a laser beam along the streets L of the wafer W to form laser-processed grooves (this processing will be referred to as laser processing). Then, the laser processing apparatus 1 removes the protective film from the surface of the wafer W after the laser processing.

The laser processing apparatus 1 includes a chuck table 10 and a laser beam irradiation unit 20 as shown in FIG. 3. Furthermore, the laser processing apparatus 1 includes a cassette elevator (not shown) on which a cassette 30 to house the wafer W before and after laser processing is placed, a provisional placement unit 40 on which the wafer W before and after laser processing is temporarily placed, and a protective film forming-and-cleaning unit 50 that forms the protective film on the wafer W before laser processing and removes the protective film from the wafer W after laser processing. Moreover, the laser processing apparatus 1 includes X-axis movement means (not shown) that causes the relative movement of the chuck table 10 and the laser beam irradiation unit 20 in an X-axis direction, Y-axis movement means (not shown) that causes the relative movement of the chuck table 10 and the laser beam irradiation unit 20 in a Y-axis direction, and Z-axis movement means (not shown) that causes the relative movement of the chuck table 10 and the laser beam irradiation unit 20 in a Z-axis direction.

The chuck table 10 holds the wafer W on which the protective film is formed when laser processing is carried out on this wafer W. The chuck table 10 has a circular disc shape in which the part forming the surface is formed of porous ceramic or the like. The chuck table 10 is connected to a vacuum suction source (not shown) via a vacuum suction path (not shown) and sucks the wafer W placed on the surface to hold this wafer W. The chuck table 10 is provided to be movable in the X-axis direction by the X-axis movement means over a carry-out/in region TR around the cassette 30 and a processing region PR around the laser beam irradiation unit 20, and is provided to be movable in the Y-axis direction by the Y-axis movement means.

The laser beam irradiation unit 20 is provided in the processing region PR set in an apparatus main body 2 and irradiates the surface of the wafer W held by the chuck table 10 with a laser beam to form laser-processed grooves. The laser beam is a laser beam having such a wavelength as to be absorbed by the wafer W. The laser beam irradiation unit 20 is provided to be movable in the Z-axis direction by the Z-axis movement means relative to the wafer W held by the chuck table 10. The laser beam irradiation unit 20 includes an oscillator 21 that oscillates the laser beam and a light collector 22 that collects the laser beam oscillated by this oscillator 21. The frequency of the laser beam oscillated by the oscillator 21 is adjusted as appropriate according to the kind of wafer W, the processing form, and so forth. As the oscillator 21, a YAG laser oscillator, a YVO4 laser oscillator, or the like can be used for example. The light collector 22 is configured to include a total reflection mirror that changes the traveling direction of the laser beam oscillated by the oscillator 21, a collecting lens that collects the laser beam, and so forth.

The cassette 30 houses plural wafers W each stuck to a ring-shaped frame F with the intermediary of an adhesive tape T. The cassette elevator is provided in the apparatus main body 2 of the laser processing apparatus 1 movably up and down in the Z-axis direction. The provisional placement unit 40 takes out one wafer W before laser processing from the cassette 30 and houses the wafer W after laser processing in the cassette 30. The provisional placement unit 40 is configured to include carry-out/in means 41 that takes out the wafer W before laser processing from the cassette 30 and inserts the wafer W after laser processing into the cassette 30 and a pair of rails 42 on which the wafer W before and after laser processing is temporarily placed.

The wafer W before laser processing on the pair of rails 42 is conveyed to the protective film forming-and-cleaning unit 50 by first conveying means 61, and the protective film forming-and-cleaning unit 50 forms a protective film on this wafer W before laser processing. Furthermore, the wafer W after laser processing is conveyed to the protective film forming-and-cleaning unit 50 by second conveying means 62, and the protective film forming-and-cleaning unit 50 removes the protective film on this wafer W after laser processing. These first and second conveying means 61 and 62 are each configured to be capable of adsorbing the surface of the wafer W and lifting up the wafer W for example. The first and second conveying means 61 and 62 lift up the wafer W and convey the wafer W to a desired position.

Figure 4:
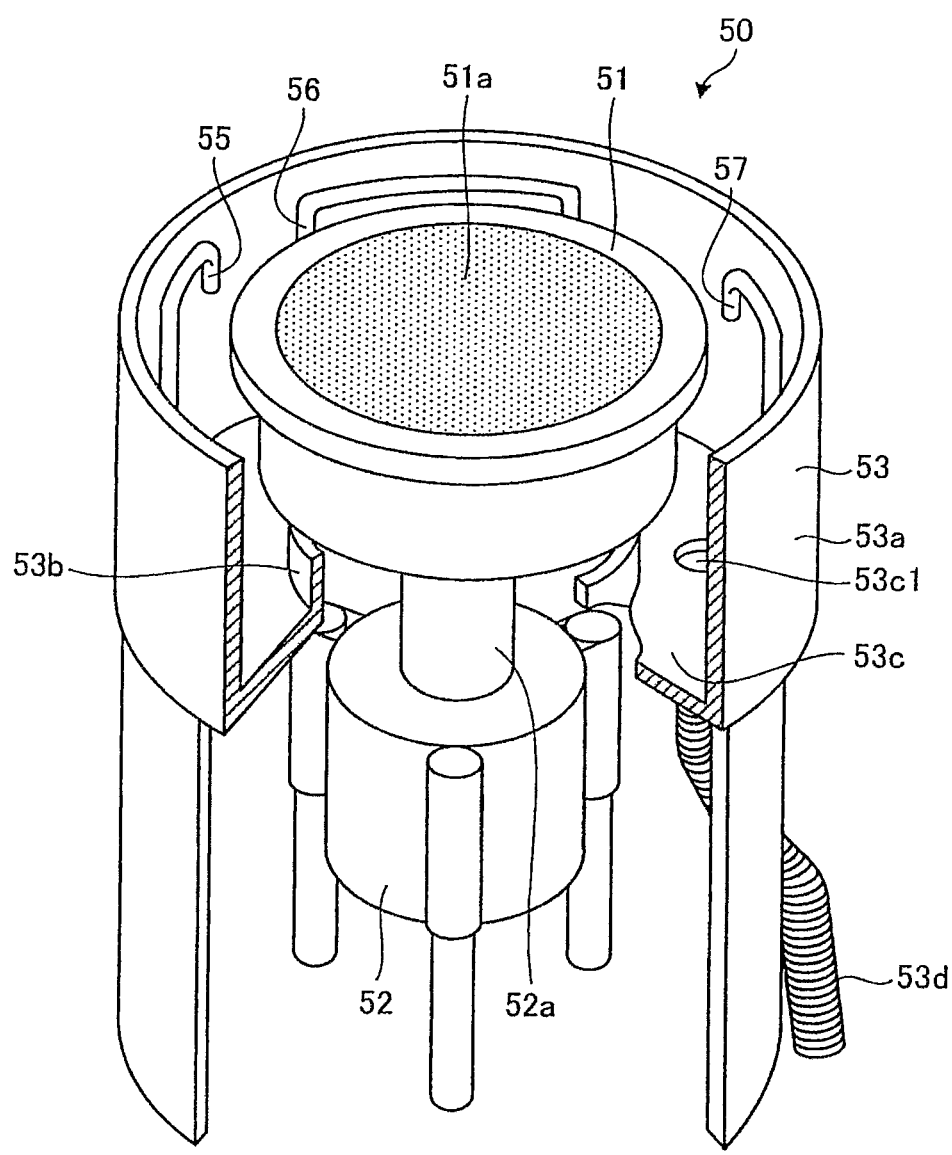
FIG. 4 is a perspective view showing a configuration example of a protective film forming-and-cleaning unit of the laser processing apparatus.

As shown in FIG. 4, the protective film forming-and-cleaning unit 50 includes a spinner table 51 that holds the wafer W before and after laser processing, an electric motor 52 that rotates this spinner table 51 around an axial center parallel to the Z-axis direction (see FIG. 3), and a water receiving unit 53 disposed around the spinner table 51. The spinner table 51 is formed into a circular disc shape and has an adsorption chuck 51a formed of porous ceramic or the like at the central part of the surface (upper surface), and this adsorption chuck 51a is made to communicate with suction means (not shown). Consequently, the spinner table 51 sucks the wafer W placed on the adsorption chuck 51a to hold this wafer W.

The spinner table 51 is joined to the upper end of a drive shaft 52a of the electric motor 52 and the electric motor 52 rotatably supports this spinner table 51. The water receiving unit 53 is formed into a ring shape and includes an outside wall 52a and an inside wall 53b each having a circular cylindrical shape and a bottom wall 53c that joins these outside wall 53a and inside wall 53b. The water receiving unit 53 receives surplus of a liquid resin supplied to the surface of the wafer W when a protective film is formed on this surface, cleaning water supplied to the surface when the protective film on this surface is cleaned and removed, and so forth. A liquid discharge port 53c1 is made in the bottom wall 53c and a drain hose 53d is connected to this liquid discharge port 53c1.

Furthermore, the protective film forming-and-cleaning unit 50 includes the following nozzles: a resin liquid/ chemical supply nozzle 55 that supplies a water-soluble liquid resin to form a protective film on the wafer W held on the spinner table 51 or a liquid chemical having an amino group; an air nozzle 56 that supplies air to the wafer W supplied with the liquid resin on the spinner table 51; and a cleaning water nozzle 57 that supplies cleaning water to the wafer W after laser processing on the spinner table 51. The respective nozzles 55 to 57 are each configured to be movable to an actuation position at which the nozzle opening is located above the center of the spinner table 51 and an evacuation position at which the nozzle opening is located outside the spinner table 51.

The resin liquid/chemical supply nozzle 55 is connected to each of a liquid resin supply source and a chemical supply source via a switching valve although diagrammatic representation is omitted. By switching this switching valve, the kind of liquid supplied to the wafer W can be changed. Furthermore, it is also possible to mix the water-soluble liquid resin and the liquid chemical having an amino group and supply them. As the liquid resin, a water-soluble resin material such as PVA (polyvinyl alcohol), PEG (polyethylene glycol), and PVP (polyvinyl pyrrolidone) is used. These liquid resins are solidified by drying to form a protective film that protects the surface of the wafer W on this surface. As the chemical having an amino group, a polymer chemical such as PAA ((registered trademark) polyallylamine) and PEI (polyethylenimine) or a so-called low-molecular chemical such as MEA (monoethanolamine) and TETA (triethylenetetramine) is used for example. Furthermore, as other examples of the chemical, monoethylamine, diethylamine, DIPA (diisopropylamine), 2-aminoethanol, DEA (diethanolamine), TEA (triethanolamine), pyridine, N—N-dimethylformamide, N-2-methylpyrrolidone, or a mixture liquid of two or more kinds of them, or a material obtained by diluting them with water can also be used.

Furthermore, the air nozzle 56 blows drying air to the wafer W after cleaning to dry the wafer W, and is connected to a drying air supply source (not shown). Moreover, the cleaning water nozzle 57 is connected to a cleaning water (for example, purified water) supply source (not shown).

As described above, in the wafer W of the present embodiment, the substrate WS is formed of indium phosphide (InP; phosphorus compound). Moreover, the wafer W has the plural bumps BP (metal electrodes) on each of the surfaces of the devices D. When laser processing is carried out on this kind of wafer W, according to an experiment by the inventor and so forth, an element (in the present embodiment, P (phosphorus)) configuring the wafer W is liberated (vaporized) and diffused from the processed surface of this wafer W exposed by the laser processing. It has been proved that this diffused phosphorus reacts with nitrogen, oxygen, and water in air and generates a foreign matter (phosphoric acid ($H_3PO_4$)) on the bumps BP also after the protective film is cleaned and removed. This foreign matter lowers device characteristics such as electrical characteristics and therefore it is preferable to immediately remove the foreign matter. However, the generation rate of the foreign matter is low (foreign matter is generated over two or three days for example) and therefore it is difficult to remove the foreign matter simultaneously with the protective film when cleaning the protective film. Furthermore, the generation of the foreign matter cannot be sufficiently suppressed even when the laser processing condition, the composition of the protective film covering the surfaces of the devices at the time of laser processing, and so forth are changed.

The wafer processing method according to the present embodiment has a characteristic in suppressing the generation of the foreign matter that is possibly generated on the surfaces of the devices D (particularly, bumps BP) and contains phosphorus. Next, the wafer processing method will be described.

First Embodiment

Figure 5:
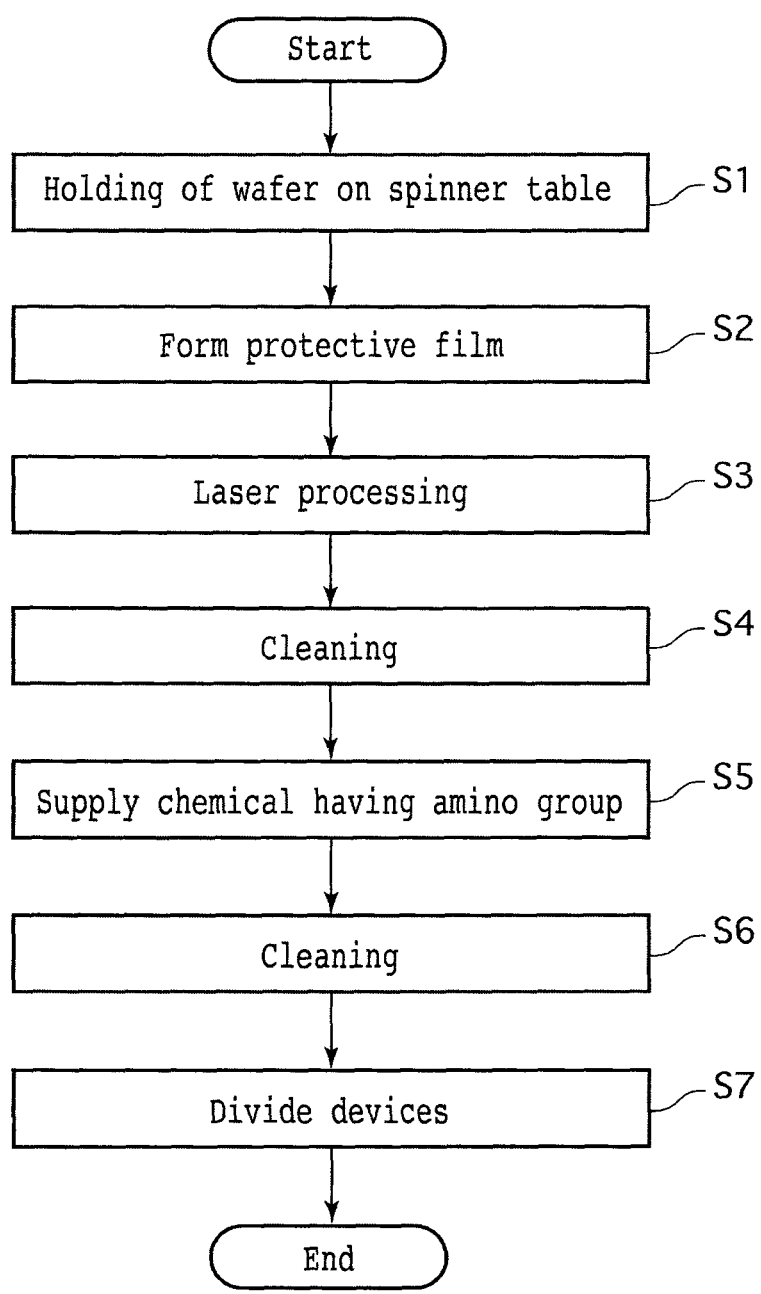
FIG. 5 is a flowchart showing the procedure of a wafer processing method according to a first embodiment.

FIG. 5 is a flowchart showing the procedure of a wafer processing method according to a first embodiment. First, as the processing procedure, the wafer W that has not been processed is held by the spinner table 51 (step S1). Specifically, one wafer W before laser processing housed in the cassette 30 of the laser processing apparatus 1 is taken out from the cassette 30 by using the carry-out/in means 41 and this wafer W is placed on the pair of rails 42. This wafer W placed on the pair of rails 42 is conveyed to the spinner table 51 of the protective film forming-and-cleaning unit 50 by the first conveying means 61. On the spinner table 51, the wafer W placed on the adsorption chuck 51a is sucked to be held.

Figure 6:
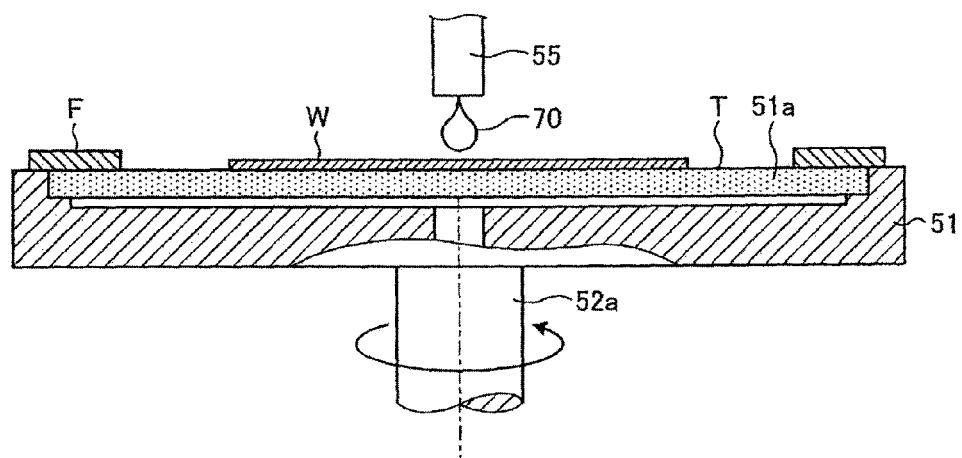
FIG. 6 is a sectional view showing a protective film forming step.
Figure 7:
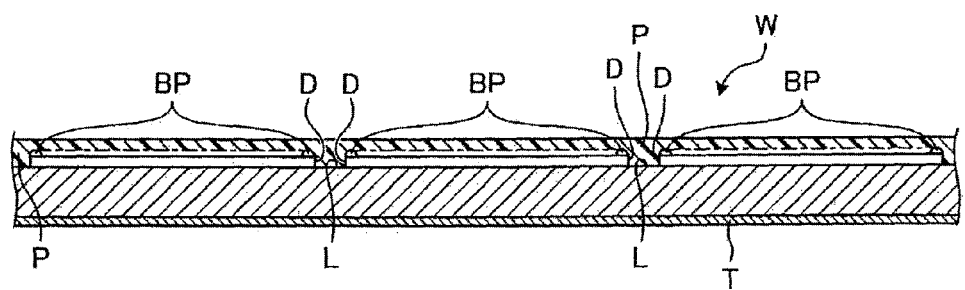
FIG. 7 is a sectional view of the major part of the wafer on which a protective film is formed.

Next, a protective film is formed on the surface of the wafer W (step S2: protective film forming step). Specifically, as shown in FIG. 6, in the state in which the resin liquid/chemical supply nozzle 55 is disposed above the wafer W and the spinner table 51 is rotated at a predetermined rotation speed, a water-soluble liquid resin (for example, PVA (polyvinyl alcohol)) 70 is supplied from the resin liquid/chemical supply nozzle 55 to the wafer W. In this case, the switching valve is operated to cause the resin liquid/chemical supply nozzle 55 to communicate with the resin liquid supply source. Furthermore, it is preferable that the supply port of the resin liquid/chemical supply nozzle 55 be located above the rotational axis of the spinner table 51. According to this, the supplied liquid resin 70 spreads from the center of the wafer W outward in the radial direction due to the centrifugal force accompanying the rotation of the spinner table 51. Thus, by solidifying the liquid resin 70 in this state, a protective film P is formed on the surface of the wafer W as shown in FIG. 7.

Figure 8:
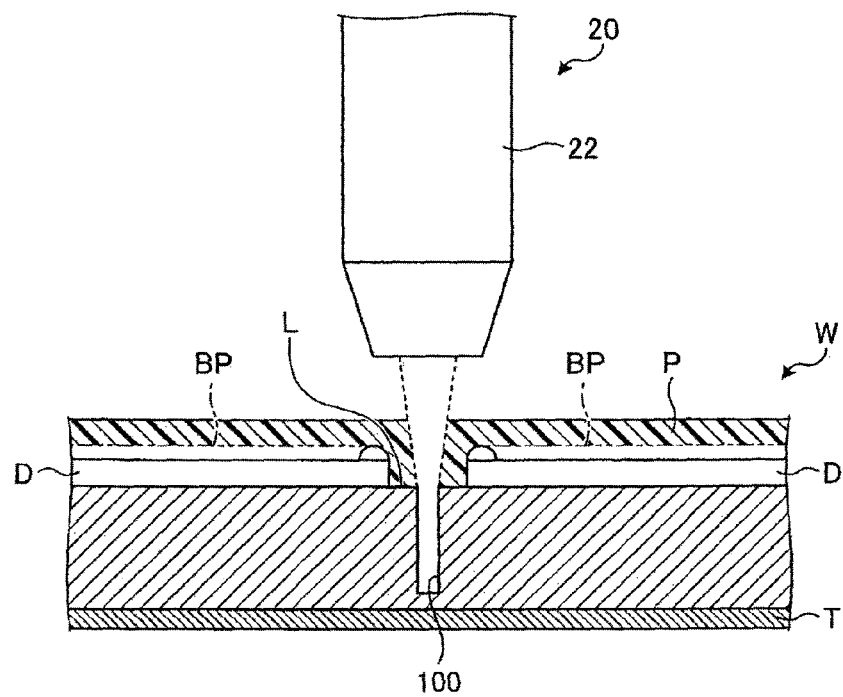
FIG. 8 is a sectional view showing a laser beam irradiating step.

Next, laser processing is carried out (step S3: laser beam irradiating step). In this case, the wafer W is conveyed from on the spinner table 51 of the protective film forming-and-cleaning unit 50 to on the chuck table 10 by the second conveying means 62. On the chuck table 10, the wafer W placed on the surface is sucked to be held. Then, the laser beam irradiation unit 20 irradiates a laser beam from the light collector 22 toward the predetermined streets L through the protective film P on the wafer W. While the laser beam is irradiated, the chuck table 10 is moved in the X-axis direction or the Y-axis direction at a predetermined feed speed (for example, 100 ram/second) by the X-axis movement means or the Y-axis movement means. Thereby, as shown in FIG. 8, laser-processed grooves 100 are formed along the predetermined streets L by ablation processing.

Next, the protective film is removed by cleaning (step S4). In this case, the wafer W after laser processing is conveyed from on the chuck table 10 to on the spinner table 51 of the protective film forming-and-cleaning unit 50 again by the second conveying means 62. Then, the wafer W is held by the adsorption chuck 51a of the spinner table 51. Although diagrammatic representation is omitted, in the state in which the cleaning water nozzle 57 is disposed above the wafer W and the spinner table 51 is rotated at a predetermined rotation speed, cleaning water is supplied from the cleaning water nozzle 57 to the wafer W. Because the protective film P (FIG. 7) is formed by drying the water-soluble liquid resin, this protective film dissolves in the cleaning water and is removed from the surface of the wafer W by supplying the cleaning water toward the protective film. In this case, debris generated by the laser processing is removed from the surface of the wafer W together with the protective film.

Figure 9:
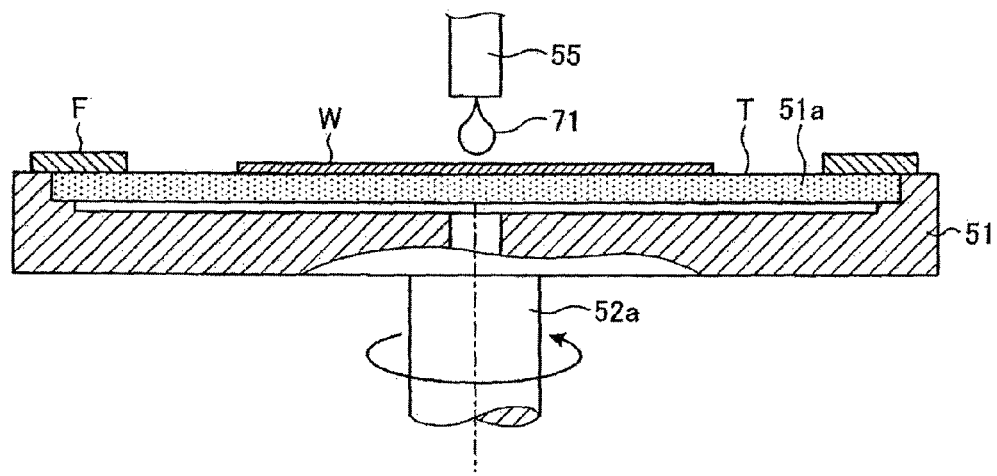
FIG. 9 is a sectional view showing a step of supplying a chemical having an amino group.

Next, a chemical having an amino group is supplied to the wafer W (step S5). Specifically, as shown in FIG. 9, in the state in which the resin liquid/chemical supply nozzle 55 is disposed above the wafer W and the spinner table 51 is rotated at a predetermined rotation speed, a water-soluble chemical 71 having an amino group (for example, MEA (monoethanolamine)) is supplied from the resin liquid/chemical supply nozzle 55 to the wafer W. In this case, the switching valve is operated to cause the resin liquid/chemical supply nozzle 55 to communicate with the chemical supply source. Due to this, the amino group possessed by the monoethanolamine reacts with phosphorus diffused from the laser-processed grooves 100 and a compound containing the phosphorus (for example, ammonium phosphate $(NH_4)_3PO_4$) is generated. This compound (ammonium phosphate) exhibits water solubility and has a short reaction (generation) time compared with phosphoric acid ($H_3PO_4$). For this reason, by supplying the chemical having an amino group to the wafer W, generation of the phosphoric acid ($H_3PO_4$) as a foreign matter is suppressed due to the generation of the compound containing phosphorus (ammonium phosphate).

Next, the compound containing phosphorus is removed by cleaning (step S6: removing step). Specifically, although diagrammatic representation is omitted, in the state in which the cleaning water nozzle 57 is disposed above the wafer W again and the spinner table 51 is rotated at a predetermined rotation speed, cleaning water is supplied from the cleaning water nozzle 57 to the wafer W. As described above, the compound (ammonium phosphate) exhibits water solubility. Thus, the compound dissolves in the cleaning water and is removed from the surface of the wafer W. This can suppress the generation of the foreign matter containing phosphorus (phosphoric acid) onto the surface of the wafer W (particularly, surfaces of the bumps BP) and thus can favorably keep the device characteristics. After the cleaning, drying air is supplied from the air nozzle 56 for a predetermined time to dry the surface of the wafer W. Finally, the devices D are divided along the laser-processed grooves 100 (step S7) and the processing is ended.

According to this first embodiment, there is provided a wafer processing method in which the wafer W in which the devices D are formed in plural regions marked out by the plural streets L formed in a lattice manner on a surface of the substrate WS composed of a phosphorus compound and the bumps BP are formed over the surface is subjected to laser processing along the streets L. The wafer processing method includes a step of holding the wafer W (step S1), a protective film forming step of forming a water-soluble protective film on the surface of the wafer W (step S2), a laser beam irradiating step of irradiating the wafer W with a laser beam along the streets L after the protective film forming step (step S3), and a step of supplying a chemical having an amino group to the wafer W (step S5). Furthermore, the wafer processing method includes a removing step of cleaning and removing a compound that is generated by the supply of the chemical having an amino group and contains phosphorus (step S6). Thus, generation of phosphoric acid ($H_3PO_4$) as a foreign matter on the surface of the wafer W can be effectively suppressed and the device characteristics can be favorably kept.

In this first embodiment, the wafer processing method includes a cleaning step of removing the protective film by cleaning (step S4) between the laser beam irradiating step (step S3) and the step of supplying the chemical having an amino group (step S5). Thus, the surface of the wafer W is cleaned before the step of supplying the chemical having an amino group (step S5). This can suppress the influence of the protective film and debris on the reaction between the amino group and the phosphorus.

It is also possible to omit the cleaning step (step S4) carried out between the laser beam irradiating step (step S3) and the step of supplying the chemical having an amino group (step S5). In this case, shortening of the processing time through the decrease in the number of steps and reduction in the use amount of cleaning water can be realized.

Second Embodiment

Figure 10:
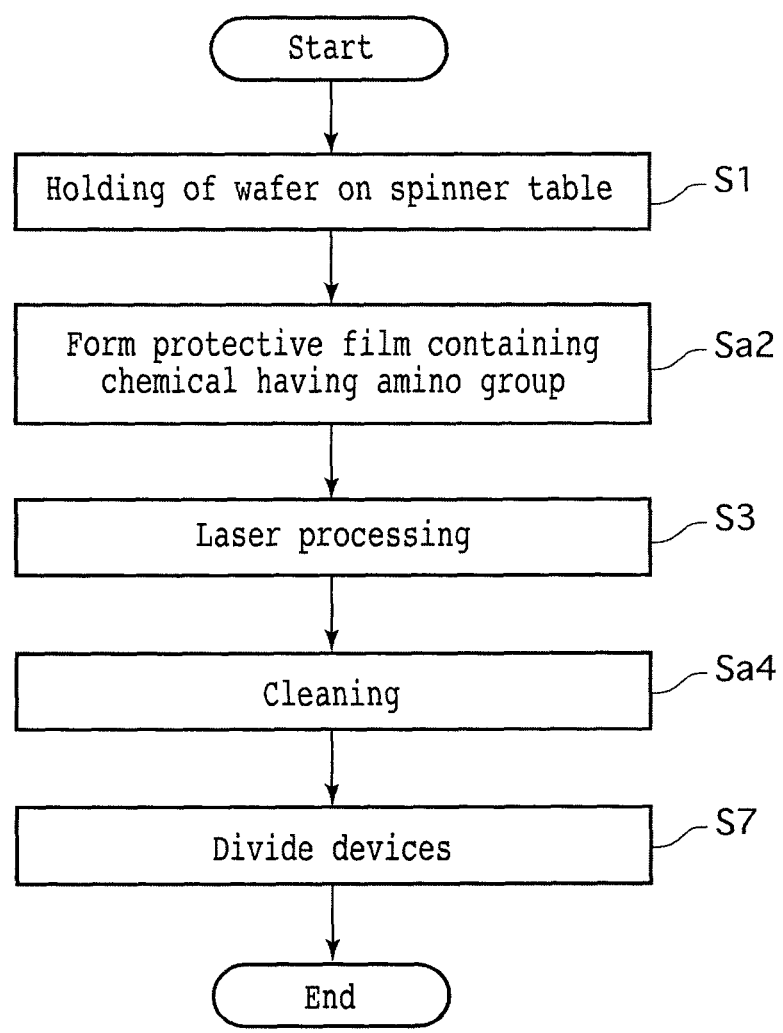
FIG. 10 is a flowchart showing the procedure of a wafer processing method according to a second embodiment.
Figure 11:
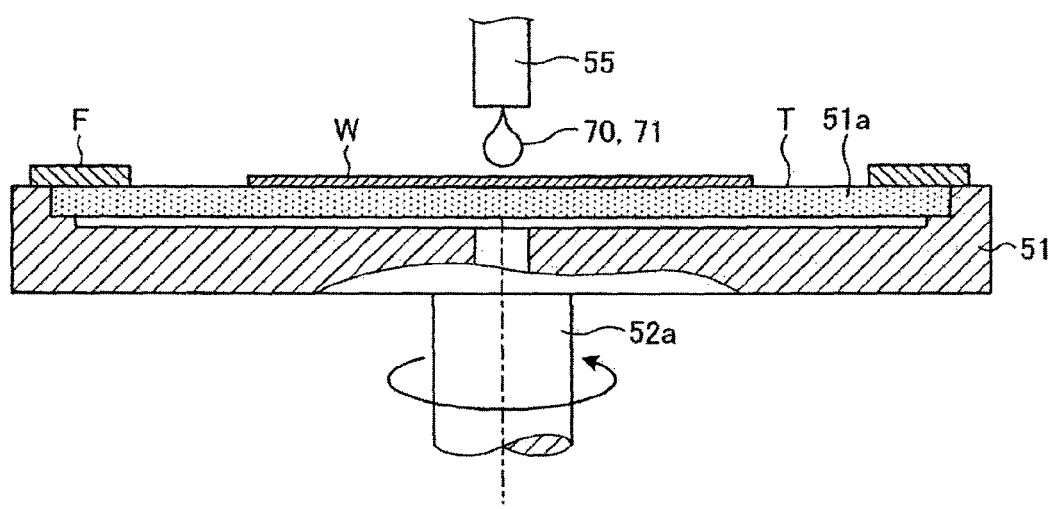
FIG. 11 is a sectional view showing a protective film forming step containing a chemical having an amino group.

FIG. 10 is a flowchart showing the procedure of a wafer processing method according to a second embodiment. Description is omitted about the same procedure as the procedure described in the first embodiment. First, the wafer W that has not been processed is held by the spinner table 51 (step S1). Next, a protective film containing a chemical having an amino group is formed on the surface of the wafer W (step Sa2: protective film forming step and step of supplying a chemical having an amino group). This step of supplying the chemical having an amino group is carried out before a laser beam irradiating step (step S3). In this second embodiment, a water-soluble liquid resin and the chemical having an amino group are supplied when the protective film is formed. Specifically, as shown in FIG. 11, in the state in which the resin liquid/chemical supply nozzle 55 is disposed above the wafer W and the spinner table 51 is rotated at a predetermined rotation speed, the water-soluble liquid resin (for example, PVA (polyvinyl alcohol)) 70 and the chemical 71 having an amino group (for example, MEA (monoethanolamine)) are supplied from the resin liquid/chemical supply nozzle 55 to the wafer W. In this case, the switching valve may be adjusted so that the liquid resin 70 and the chemical 71 having an amino group may be mixed at a predetermined ratio, or a mixture liquid obtained by mixing the liquid resin 70 and the chemical 71 having an amino group in advance may be supplied from the resin liquid/chemical supply nozzle 55. In this configuration, the liquid resin 70 is solidified by drying and thereby the protective film P (FIG. 7) containing the chemical 71 having an amino group is formed on the surface of the wafer W.

Next, laser processing is carried out (step S3: laser beam irradiating step). The laser-processed grooves 100 (see FIG. 8) are formed by this laser processing. At this time, the amino group possessed by the monoethanolamine reacts with phosphorus diffused from the laser-processed grooves 100 and a compound containing the phosphorus (for example, ammonium phosphate $(NH_4)_3PO_4$) is generated. Thus, generation of phosphoric acid ($H_3PO_4$) as a foreign matter is suppressed due to the generation of the compound containing phosphorus (ammonium phosphate).

Next, the protective film containing the chemical 71 having an amino group is removed by cleaning (step Sa4). In this case, although diagrammatic representation is omitted, in the state in which the cleaning water nozzle 57 is disposed above the wafer W and the spinner table 51 is rotated at a predetermined rotation speed, cleaning water is supplied from the cleaning water nozzle 57 to the wafer W. The protective film and the compound containing phosphorus (ammonium phosphate) each exhibit water solubility. For this reason, by supplying the cleaning water toward the protective film containing the chemical 71 having an amino group, the protective film and the compound containing phosphorus (ammonium phosphate) dissolve in the cleaning water and are removed from the surface of the wafer W. In this case, debris generated by the laser processing is also removed from the surface of the wafer W together with the protective film. This can suppress the generation of the foreign matter containing phosphorus (phosphoric acid) onto the surface of the wafer W (particularly, surfaces of the bumps BP) and thus can favorably keep the device characteristics. Finally, the devices D are divided along the laser-processed grooves 100 (step S7) and the processing is ended.

In this second embodiment, the step of supplying the chemical having an amino group to the wafer W (step Sa2) is carried out before the laser beam irradiating step (step S3), and the chemical 71 having an amino group is mixed into the water-soluble liquid resin 70 to form the protective film and is supplied to the surface of the wafer W. Thus, while the generation of the foreign matter containing phosphorus (phosphoric acid) onto the surface of the wafer W (particularly, surfaces of the bumps BP) is suppressed, the number of steps can be reduced compared with the first embodiment.

Although the embodiments of the present invention are described above, the embodiments are presented as an example and do not intend to limit the scope of the invention. The embodiments can be carried out in other various forms and various kinds of omission, replacement, and change can be carried out without departing from the gist of the invention. The embodiments and modifications thereof are included in the invention set forth in the scope of claims and the scope of equivalence thereof similarly to being included in the scope and gist of the invention.

Comparative Examples

The inventor made experiments with use of other chemicals as comparative examples besides the above-described chemical having an amino group. Specifically, (1) IPA (isopropyl alcohol) and (2) liquid nitrogen ($N_2$) were used as the chemicals. Furthermore, in the above-described step S5 in the first embodiment, the above-described chemicals (1) and (2) were each supplied to the wafer W instead of the water-soluble chemical having an amino group (for example, MEA (monoethanolamine)). The other procedure was the same as the step S1 to the step S7 excluding the step S5. In these comparative examples, generation of a foreign matter containing phosphorus (phosphoric acid ($H_3PO_4$)) was recognized in both procedures using (1) IPA (isopropyl alcohol) and (2) liquid nitrogen ($N_2$). This will be because neither (1) IPA (isopropyl alcohol) nor (2) liquid nitrogen ($N_2$) generates a water-soluble compound with phosphorus and therefore the foreign matter containing phosphorus (phosphoric acid ($H_3PO_4$)) was generated over time. As above, treating the surface of the wafer by using the chemical having an amino group is very effective to effectively suppress generation of the foreign matter onto the surface of the wafer.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method in which a wafer in which devices are formed in a plurality of regions marked out by a plurality of streets formed in a lattice manner on a surface of a substrate composed of a phosphorus compound and metal electrodes are formed over the surface is subjected to laser processing along the streets, the wafer processing method comprising:
   a step of holding the wafer by a chuck table;
   a protective film forming step of forming a water-soluble protective film on a surface of the wafer;
   a laser beam irradiating step of irradiating the wafer with a laser beam along the streets after the protective film forming step;
   a step of supplying a chemical having an amino group to the wafer; and
   a removing step of cleaning and removing a compound that is generated on the wafer by the supplying of the chemical, wherein the generated compound contains phosphorus.

2. The wafer processing method according to claim 1, wherein:
   the step of supplying the chemical having an amino group to the wafer is carried out after the laser beam irradiating step.

3. The wafer processing method according to claim 1, wherein:
   the phosphorous compound of the substrate comprises indium phosphide;
   the chemical having an amino group comprises monoethanolamine; and
   the generated compound that contains phosphorus comprises ammonium phosphate.

4. The wafer processing method according to claim 1, wherein the chemical having an amino group comprises monoethanolamine.

5. The wafer processing method according to claim 1, wherein the chemical having an amino group comprises polyallylamine.

6. The wafer processing method according to claim 1, wherein the chemical having an amino group comprises polyethylenimine.

7. The wafer processing method according to claim 1, wherein the chemical having an amino group comprises triethylenetetramine.

8. The wafer processing method according to claim 1, wherein the chemical having an amino group comprises monoethylamine.

9. The wafer processing method according to claim 1, wherein the chemical having an amino group comprises diethylamine.

10. The wafer processing method according to claim 1, wherein the chemical having an amino group comprises diisopropylamine.

11. The wafer processing method according to claim 1, wherein the chemical having an amino group comprises 2-aminoethanol.

12. The wafer processing method according to claim 1, wherein the chemical having an amino group comprises diethanolamine.

13. The wafer processing method according to claim 1, wherein the chemical having an amino group comprises triethanolamine.

14. The wafer processing method according to claim 1, wherein the chemical having an amino group comprises pyridine.

15. The wafer processing method according to claim 1, wherein the chemical having an amino group comprises N—N-dimethylformamide.

16. The wafer processing method according to claim 1, wherein the chemical having an amino group comprises N-2-methylpyrrolidone.

17. The wafer processing method according to claim 1, wherein the generated compound that contains phosphorus has a shorter generation time than a generation time of phosphoric acid, during the removing step, and thus generation of phosphoric acid is suppressed due to the generation of the generated compound.

18. A wafer processing method in which a wafer in which devices are formed in a plurality of regions marked out by a plurality of streets formed in a lattice manner on a surface of a substrate composed of a phosphorus compound and metal electrodes are formed over the surface is subjected to laser processing along the streets, the wafer processing method comprising:
- a step of holding the wafer by a chuck table;
- a protective film forming step of forming a water-soluble protective file on a surface of the wafer;
- a laser beam irradiating step of irradiating the wafer with a laser beam along the streets after the protective film forming step;
- a step of supplying a chemical having an amino group to the wafer; and
- a removing step of cleaning and removing a compound that is generated on the wafer by the supplying of the chemical and contains phosphorus, and
- wherein the step of supplying the chemical having an amino group to the wafer is carried out before the laser beam irradiating step, and the chemical having an amino group is mixed into the water-soluble protective film and is supplied to the surface of the wafer.

* * * * *